(12) United States Patent
Hanberry

(10) Patent No.: US 12,302,586 B2
(45) Date of Patent: May 13, 2025

(54) NANOMAGNETIC DATA STORAGE AND PROCESSING DEVICES

(71) Applicant: Hanberry LLC, Seattle, WA (US)

(72) Inventor: Madison Hanberry, Seattle, WA (US)

(73) Assignee: Hanberry LLC, Seattle, WA (US)

( * ) Notice: Subject to any disclaimer, the term of this patent is extended or adjusted under 35 U.S.C. 154(b) by 187 days.

(21) Appl. No.: 18/127,161

(22) Filed: Mar. 28, 2023

(65) Prior Publication Data

US 2024/0334711 A1    Oct. 3, 2024

(51) Int. Cl.
| | |
|---|---|
| *H10B 61/00* | (2023.01) |
| *G11C 11/10* | (2006.01) |
| *H03K 19/20* | (2006.01) |
| *H10N 59/00* | (2023.01) |

(52) U.S. Cl.
CPC .............. *H10B 61/00* (2023.02); *G11C 11/10* (2013.01); *H03K 19/20* (2013.01); *H10N 59/00* (2023.02)

(58) Field of Classification Search
None
See application file for complete search history.

(56) References Cited

U.S. PATENT DOCUMENTS

| | | | |
|---|---|---|---|
| 8,198,919 B1 * | 6/2012 | Kozhanov | H03K 19/20 326/54 |
| 9,979,402 B2 * | 5/2018 | Vaysset | H03K 19/23 |
| 10,593,414 B2 * | 3/2020 | Vaysset | G11C 11/1673 |

OTHER PUBLICATIONS

Tunable configurational anisotropy of concave triangular nanomagnets, Journal of Applied Physics 119, 233906, Jun. 21, 2016 (5 pages).
Six-fold congurational anisotropy and magnetic reversal in nanoscale Permalloy triangles, L. Thevenard, et al., Jul. 9, 2021 (4 pages).

* cited by examiner

*Primary Examiner* — Jany Richardson
(74) *Attorney, Agent, or Firm* — Liang IP, PLLC

(57) ABSTRACT

Techniques of processing and/or persistently store data using nanomagnetic elements are disclosed herein. In one example, a processing circuit includes a substrate and a plurality of nanomagnetic elements spaced apart from one another. The plurality of nanomagnetic elements have shape-induced magnetic anisotropy and individually include a geometric center and at least three vertices extending away from the geometric center. One of the nanomagnetic elements has a vertex magnetically coupled to another vertex of another nanomagnetic element such that a magnetic polarity change at the vertex at the one of the plurality of nanomagnetic elements causes a responsive magnetic polarity change at the vertex at the another nanomagnetic element to generate an output of the processing circuit.

20 Claims, 6 Drawing Sheets

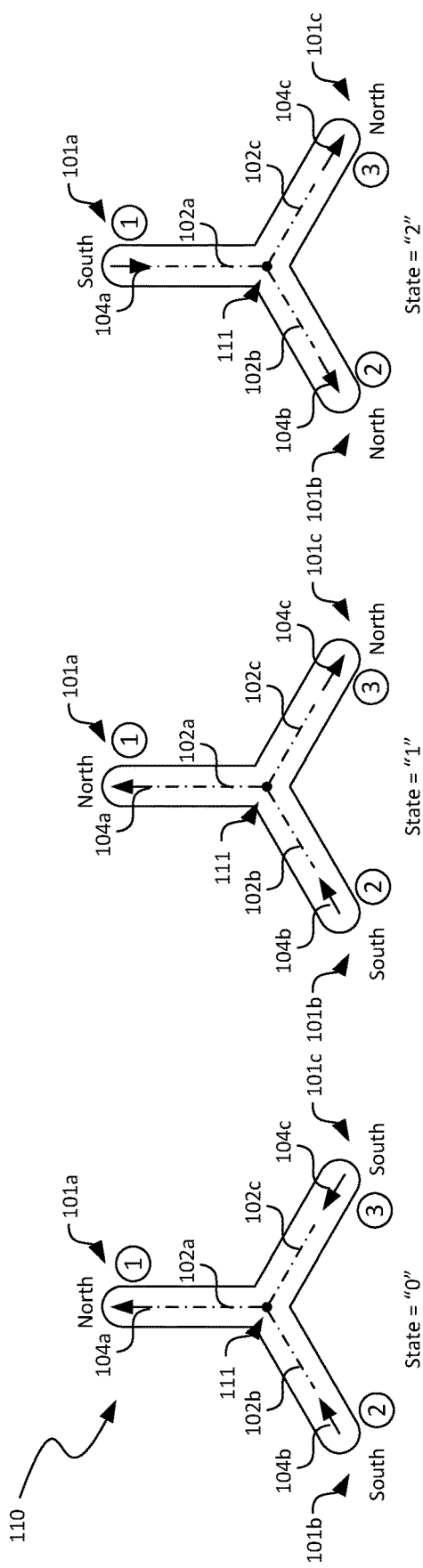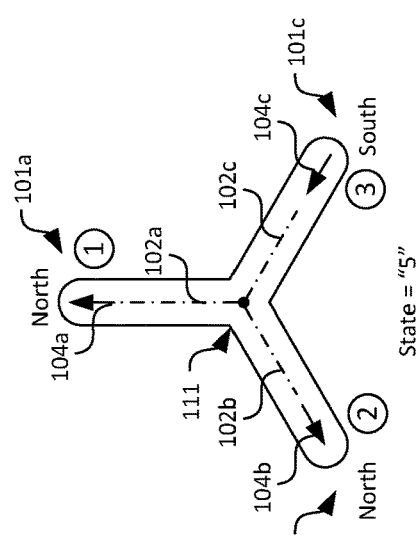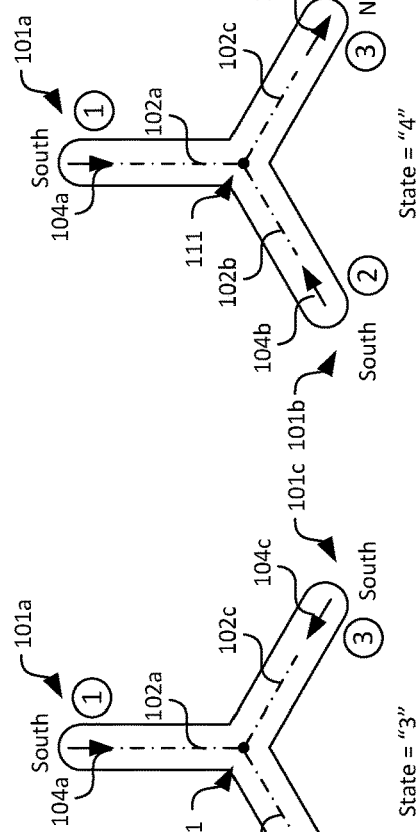

NANOMAGNETIC DATA STORAGE AND PROCESSING DEVICES

BACKGROUND

Servers, personal computers, smartphone, tablets, and other types of computing devices typically include a central processing unit ("CPU") or processor, operatively coupled to a system memory and a persistent storage device containing codes of applications and user data. An example of the system memory can include dynamic random-access memory ("DRAM") while examples of the persistent storage device include hard disk drives ("HDDs") and solid-state drives ("SSDs"). During operation, upon receiving an input from a user, the CPU can instruct the system memory to load codes of an application and necessary user data from the persistent storage device. The CPU can then fetch portions of the codes from the system memory into local registers before processing the fetched codes to generate results for the user.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In the computing devices described above, data processing components of the CPU, such as algorithmic processing unit ("ALU") is separate from the system memory and local registers. Instead, data buses connect the ALU to the system memory and the local registers for sharing data. For example, during operation, data can be fetched from the system memory and stored at the local registers via one data bus. The ALU can then process the fetched data in the local registers to generate execution results. The generated execution results in turn can be transferred to the system memory and/or the persistent storage device via the same or another data bus. Such transfer of data though can result in high operational complexity, risks of data corruption during transport, and substantial power consumption.

Another drawback of the foregoing computing device is the requirement of a constant power supply to the system memory and the local registers to maintain processor states during operation. Examples of a processor state can include data generated by the ALU when processing codes loaded in the local register. For example, the ALU can execute an application that adds a series of input numbers to generate a sum. A current value of the sum represents a current processor state of the application. When stored at the local registers or the system memory, a constant power supply is needed to "refresh" DRAMs of the local registers or the system memory to maintain such processor states. If the power supply is interrupted during processing, portions of the processor state can be lost.

In addition, the foregoing computing devices typically operate on binary data. For example, a bit can represent a value of either zero or one. Multiple bits (e.g., eight) can then be combined into a data set, i.e., a byte. Multiple bytes (e.g., four) can then be grouped into a higher-level data set, such as a word. One drawback of processing data in binary is the low information density of binary data because each bit only has two possible states, i.e., zero or one. To obtain additional states, multiple bits are to be used. For example, to have four states, i.e., zero, one, two, and three, two bits are needed to represent such states as (0, 0), (0, 1), (1, 0), and (1, 1). Thus, accessing and/or storing information in binary can add to data access latency, increase power consumption, and consume large data storage spaces.

Several embodiments of the disclosed technology are directed to a single device that utilizes multiple magnetically coupled anisotropic nanomagnetic triangles each supporting a single magnetic domain for data processing and/or storage. In certain implementations, the nanomagnetic triangles can be constructed from iron, nickel-iron, or other suitable types of alloys via sputter deposition, lithography patterning, or other suitable techniques. An example technique for forming such nanomagnetic triangles is discussed in publication entitled "Tunable configurational anisotropy of concave triangular nanomagnets" by Kasuni Nanayakkara et al., the disclosure of which is incorporated herein in its entirety. In other implementations, the nanomagnetic triangles can be formed with other suitable magnetic or semi-magnetic materials.

According to aspects of the disclosed technology, a nanomagnetic triangle can include first, second, and third axes (referred to collectively as "axes") extending from a center of the nanomagnetic triangle toward first, second, and third vertices (referred to collectively as "vertices"). Each axis can have a magnetic ground state different than those of the other axes. For ease of description, in the present disclosure, a magnetic direction extending away from the center of the nanomagnetic triangle toward one of the vertices is referred to as having a "North" direction while the opposite is referred to as having a "South" direction. Also, in the illustrated embodiments, having a North direction is encoded as a logic "1" while having a South direction is encoded as a logic "0" for illustration purposes. In other embodiments, the encoding of logic values can be reversed or have other suitable configurations. The nanomagnetic triangle can also have first, second, and third sides (referred to collectively as "sides") between pairs of the vertices. In one example, the sides of the nanomagnetic triangles can each be linear or form a straight line. In other examples, the sides of the nanomagnetic triangles can be curved, multi-collinear, or can have other suitable shapes or configurations.

It is believed that magnetic directions along different axes of the nanomagnetic triangle are correlated in such a way as to avoid having a magnetic monopole. A magnetic monopole is a hypothetical elementary particle that is an isolated magnet with only one magnetic pole (e.g., a North pole without a South pole, or vice versa). A magnetic monopole would have a net North or South "magnetic charge." In practical applications, it is believed that no known experimental or observational evidence exists to support that magnetic monopoles exist. As such, the nanomagnetic triangle would have at least one axis with a magnetic direction that is different than the other axes to avoid forming a magnetic monopole. For example, the first axis can have a North direction while the second and third axes have a South direction, or vice versa. In addition, for the same reason, when magnetic directions of two axes are fixed (e.g., with an external bias), the magnetic direction of the remaining axis can be flipped. For instance, in the example above, if the first axis is switched to "South" and the second axis is fixed at "South," the magnetic direction of the third axis can be flipped from South to North to avoid forming a magnetic monopole.

Based on the foregoing characteristics of the nanomagnetic triangles, several embodiments of the disclosed technology provide a single device that can process and persistently store data without a constant power supply. In one aspect, the single device can include multiple nanomagnetic triangles coupled to one another via magnetic coupling to form processing circuits according to target logic. As used herein, "magnetic coupling" refers to the existence of magnetic interactions between two spaced-apart magnets or nanomagnets. Magnetic coupling can be achieved via placing vertices of triangles spaced apart but adjacent to one another. In certain implementations, spacing of the magnets or nanomagnets can be based on a size of the magnets or nanomagnets. For example, a spacing of approximately 10% of a size of the nanomagnetic triangles is believed to be sufficient to form a magnetic coupling. In other implementations, spacing of the magnets or nanomagnets can be based on an absolute threshold or other suitable criteria so long as magnetic interactions are maintained between the adjacent magnets or nanomagnets.

As such, nanomagnetic triangles can each be configured as a NOR, NAND, or other suitable types of gates that are magnetically coupled to one another to form a processing circuit. For example, a nanomagnetic triangle can act as a NAND gate. When two of the three vertices acting as input are both set to "1," the third vertex acting as an output is forced to "0" to avoid forming a magnetic monopole. In another example, a nanomagnetic triangle can act as a NOR gate. As such, when two of the three vertices acting as input are set to "0," the third vertex acting as an output is forced to "1" to avoid forming a magnetic monopole.

Multiple such NAND or NOR gates can be coupled together in sequence, net, or other arrangements to form a processing circuit or other types of gates. For instance, a first nanomagnetic triangle with first and second vertices as input to a NOR gate and a third vertex can be placed adjacent to a third vertex of a second nanomagnetic triangle acting as a NAND gate. The second nanomagnetic triangle also includes a first vertex as an output and a second vertex as an input of the NAND gate. In certain embodiments, individual nanomagnetic triangles and/or gates can be biased or "programmed" at runtime like operations of FPGA. In other embodiments, individual triangles and/or gates can be programmed during manufacturing and may be reprogrammable during use or at other suitable times.

During operation, the third vertex of the first nanomagnetic triangle can be initially biased to have a South polarity (or a logic "0") and magnetically coupled to the third vertex of the second nanomagnetic triangle that is biased to have a North polarity (or a logic "1"). As such, the third vertex of the second nanomagnetic triangle can be initially biased to have a South polarity (or a logic "0"). Then, when both the first and second vertices of the first nanomagnetic triangle are biased to have a South polarity or logic "0," the third vertex of the first nanomagnetic triangle would be forced to flip from a logic "0" to "1" indicating a positive result for the NOR logic. Due to the magnetic coupling between the third vertices of the first and second nanomagnetic triangles, the polarity of the third vertex of the second nanomagnetic triangle can be flipped from "1" to "0." When the second vertex of the second nanomagnetic triangle as input to the NAND is biased to "0," the polarity at the first vertex of the second nanomagnetic triangle (i.e., the output) is flipped from "0" to "1" to indicate a positive result for the NAND logic. On the other hand, if only one of the first or second vertices of the first nanomagnetic triangle is biased to "0," then the third vertex of the first nanomagnetic triangle would not change polarity. Thus, the polarity of the vertices of the second nanomagnetic triangle would be maintained to have an output of "0." The output from the first vertex of the second nanomagnetic triangle can be magnetically coupled to additional triangles to affect suitable logics.

Several embodiments of the single device can perform logic operations and persistently store processor states without a constant power supply. Unlike DRAMs, the multiple nanomagnetic triangles can modify magnetic polarities of adjacent nanomagnetic triangles and maintain respective magnetic states even when power is lost. For instance, in the foregoing example circuit, if power is lost after the input at the first and second vertices of the first nanomagnetic triangle were biased to "0," the output of "1" at the second vertex of the second nanomagnetic triangle would still be achieved via magnetic coupling and be maintained. After power is restored, a sensor (e.g., a Hall effect monitor) can then be used to read the maintained value at the first vertex of the second nanomagnetic triangle. As such, embodiments of the single device can be cost effective to operate without using backup batteries, special shutdown procedures, or other techniques in response to power losses.

In addition, several embodiments of the foregoing single device can operate not only with binary data but also heximal data, i.e., base-six data. For instance, each vertex of a nanomagnetic triangle can have two states: North (or a logic "1") or South (or a logic "0"). As such, possible combinations of magnetic states of the triangle without forming a magnetic monopole can include the following:
(1, 0, 0);
(1, 1, 0);
(0, 0, 1);
(1, 0, 1);
(0, 1, 0);
(0, 1, 1).
As such, each nanomagnetic triangle can contain three times the information than a binary bit. Information density can thus be significantly increased to reduce a size of a storage component as well as reducing data access latency.

BRIEF DESCRIPTION OF THE DRAWINGS

FIGS. 4A-4F are schematic diagrams illustrating an example heximal encoding utilizing the nanomagnetic elements of FIG. 2A in accordance with embodiments of the disclosed technology.

DETAILED DESCRIPTION

Figure 1A:
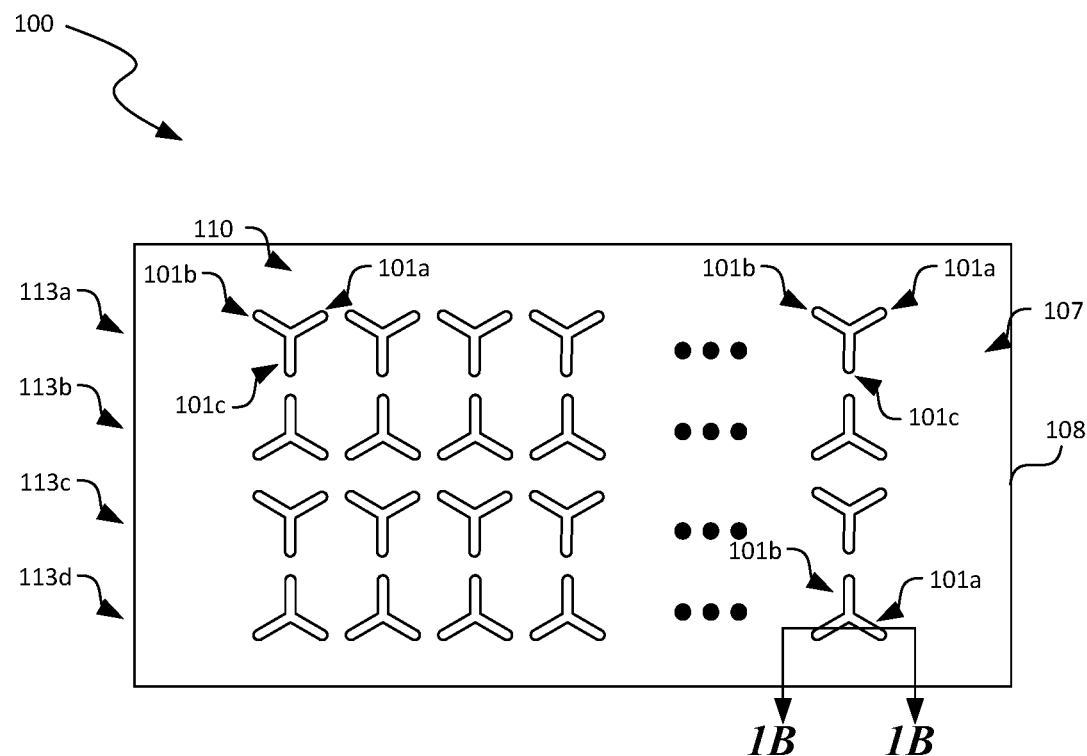
FIGS. 1A and 1B are schematic top and cross-sectional diagrams illustrating a data storage and processing device utilizing nanomagnetic elements configured in accordance with embodiments of the disclosed technology, respectively.

Certain embodiments of systems, devices, components, and processes related to storing and processing data using nanomagnetic elements, such as nanomagnetic triangles, in computing systems are described below. In the following description, specific details of components are included to provide a thorough understanding of certain embodiments of the disclosed technology. A person skilled in the relevant art will also understand that the technology can have additional embodiments. The technology can also be practiced without several of the details of the embodiments described below with reference to FIGS. 1A-5B.

As used herein, the term "nanomagnetic triangle" generally refers to triangular shaped magnets having nanoscale sizes. For example, nanomagnetic triangles can have a height of approximately 100 nanometers, 150 nanometer, 200 nanometers, or other suitable values. In certain implementations, nanomagnetic triangles can be constructed from iron, nickel-iron, or other suitable types of alloys via sputter deposition, lithography patterning, or other suitable techniques. An example technique for forming such nanomagnetic triangles is discussed in publication entitled "Tunable configurational anisotropy of concave triangular nanomagnets" by Kasuni Nanayakkara et al., the disclosure of which is incorporated herein in its entirety. In other implementations, such nanomagnetic triangles can be formed with other suitable magnetic or semi-magnetic materials.

In certain computing devices, data processing components of the CPU, such as algorithmic processing unit ("ALU") is separate from the system memory and local registers. Instead, data buses connect the ALU to the system memory and the local registers for sharing data. Thus, data transfer during operations occurs frequently during processing of the ALU. Such transfer of data though can result in high operational complexity, risks of data corruption during transport, and substantial power consumption. Another drawback of the foregoing computing device is the requirement of a constant power supply to the system memory and the local registers during operation to maintain a processor state. A constant power supply is needed to "refresh" DRAMs of the local registers or the system memory to maintain such processor states. If the power supply is interrupted during processing, portions of the processor state can be lost. In addition, the foregoing computing devices typically operate on binary data with low information density because each bit can have only two possible states, i.e., zero or one. To obtain/store additional states, multiple bits are to be used. Thus, accessing and/or storing information in binary can add to data access latency, increase power consumption, and consume large data storage spaces.

Several embodiments of the disclosed technology are directed to a storage and processing device utilizing multiple magnetically coupled anisotropic nanomagnetic triangles individually supporting a single magnetic domain for data processing and/or storage. By using such a device, processing and storage of data can be combined in a single device. As such, data transfer during processing can be reduced or even eliminated. Also, the nanomagnetic triangles of the single device can persistently store data even without a constant power supply. In addition, each nanomagnetic triangle can be encoded to carry heximal data, and thus significantly increasing information density, as described in more detail below with reference to FIGS. 1A-5B.

Figure 1B:
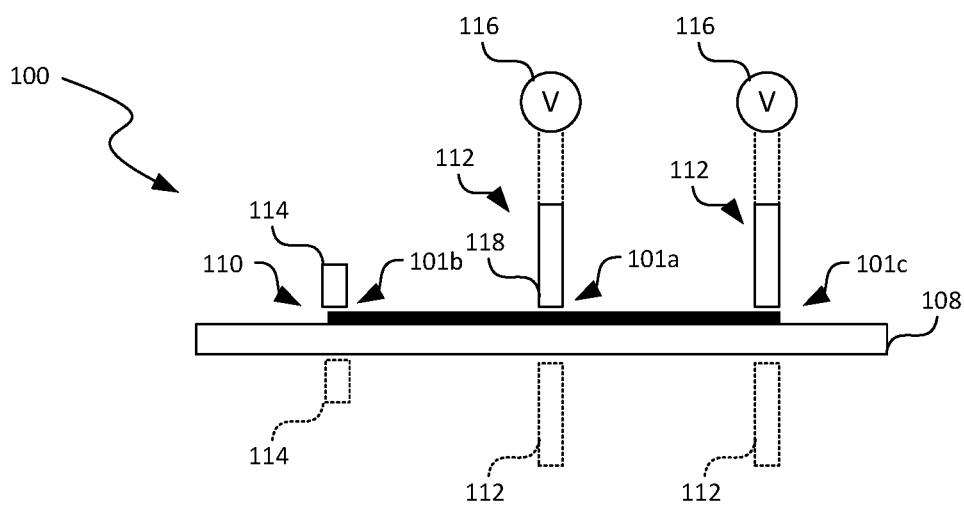

FIGS. 1A and 1B are schematic top and cross-sectional diagrams illustrating a data storage and processing device 100 utilizing nanomagnetic elements configured in accordance with embodiments of the disclosed technology, respectively. As shown in FIG. 1A, the data storage and processing device 100 can include a substrate 108 carrying multiple nanomagnetic elements 107 arranged in a suitable configuration on the substrate 108. In the illustrated embodiment of FIG. 1A, the nanomagnetic elements 107 are shown as multiple nanomagnetic triangles 110 of a shape and configuration. For example, the nanomagnetic triangles 110 each include first, second, and third vertices 101a-101c, respectively. Details of the nanomagnetic triangles 110 shown in FIG. 1A are described in more detail below with reference to FIG. 2A. In other embodiments, the nanomagnetic elements 107 can include nanomagnetic triangles 110 having other shapes and configurations, such as the examples discussed in more detail below with reference to FIGS. 2B and 2C. In further embodiments, the nanomagnetic elements 107 can also include nanomagnetic crosses, stars, or other suitable shapes and configurations (not shown).

The multiple nanomagnetic triangles 110 can be arranged in columns and rows with the same or different orientations and/or configurations. For example, as shown in FIG. 1A, the multiple nanomagnetic triangles are arranged in four rows 113a-113d. Each row 113a-113d can include multiple nanomagnetic triangles 110 in the same orientation arranged in a sequence. The orientation of adjacent rows 113a-113d are inverse of one another. In other examples, the multiple nanomagnetic triangles 110 can be arranged in a mesh, a ring, or other suitable configurations with individual nanomagnetic triangles assuming the same or different orientations.

By placing the nanomagnetic triangles 110 proximate to one another, adjacent nanomagnetic triangles 110 can be magnetically coupled to one another. As such, the multiple nanomagnetic triangles 110 can be coupled to one another via magnetic coupling to form processing circuits according to target logic. As used herein, "magnetic coupling" refers to the existence of magnetic interactions between two spaced-apart magnets or nanomagnets. Magnetic coupling can be achieved via placing nanomagnetic triangles spaced apart but adjacent to one another. In certain implementations, spacing of the nanomagnets can be based on a size of the magnets or nanomagnets. For example, a spacing of approximately 10% of a size of the nanomagnetic triangles 110 is believed to be sufficient to form a magnetic coupling. In other implementations, spacing of the magnets or nanomagnets can be based on an absolute threshold or other suitable criteria so long as magnetic interactions are maintained between the adjacent magnets or nanomagnets.

Though not shown in FIG. 1A, in certain embodiments, the storage and processing device 100 can also include magnetic interrupters placed between adjacent nanomagnetic elements 107 to interrupt a magnetic coupling between a pair of the nanomagnetic elements 107. For example, a suitable amount of an alloy of about 80% nickel, 4.5% molybdenum and balance iron can be deposited or placed between adjacent vertices 101a-101c of the nanomagnetic triangles 110. Such magnetic interrupters can be permanent or temporary. As such, a processing circuit based on target logic can be formed by selectively coupling the nanomagnetic elements 107 carried on the substrate 108, as described in more detail below with reference to FIGS. 3A-3C.

As shown in FIG. 1B, the storage and processing device 100 can also include one or more biasing components 112 and magnetic sensors 114. The biasing components 112 can be configured to bias a corresponding vertex 101a-101c of a nanomagnetic triangle 110 to a particular polarization. As shown in the illustrated example, the biasing components 112 individually include a biasing element 118 placed proximate to a vertex 101a-101c and electrically coupled to a power supply 116. In operation, the power supply 116 can be selectively actuated to provide a pulse of electricity to the biasing element 118 such that a polarity of the corresponding vertex 101a-101c is reversed. In other embodiments, the vertices 101a-101c can be biased via other suitable techniques.

Also shown in FIG. 1B, the magnetic sensors 114 can also be placed proximate to the vertices 101a-101c of the nanomagnetic triangles 110 to determine a magnetic polarity of the corresponding vertices 101a-101c. In certain embodiments, the magnetic sensors 114 can each include a Hall effect sensor. In other embodiments, the magnetic sensors 114 can include other suitable types of magnetic detectors. In certain implementations, as shown in FIG. 1B, the biasing components 112 and the magnetic sensors 114 can be placed on one side of the substrate 108. In other embodiments, at least one of the biasing components 112 and the magnetic sensors 114 can be placed on the other side of the substrate 108 (shown in phantom lines for clarity). In further embodiments, at least one of the biasing components 112 and the magnetic sensors 114 can be embedded in or carried by the substrate 108.

In operation, the biasing components 112, the magnetic sensors 114, and the optional magnetic interrupters (not shown) can be used to initially configure a processing circuit based on target logic. Subsequently, an input signal, such as a biasing input to at least one of the vertices 101a-101c of the nanomagnetic triangles 110 can be delivered to a corresponding biasing component 114. In response to receiving the input signal, the configured processing circuit can process the received input signal based on the target logic and generate a result in response to the input signal. Example operations of the storage and processing device 100 are described in more detail below with reference to FIGS. 5A and 5B.

Figure 2A:
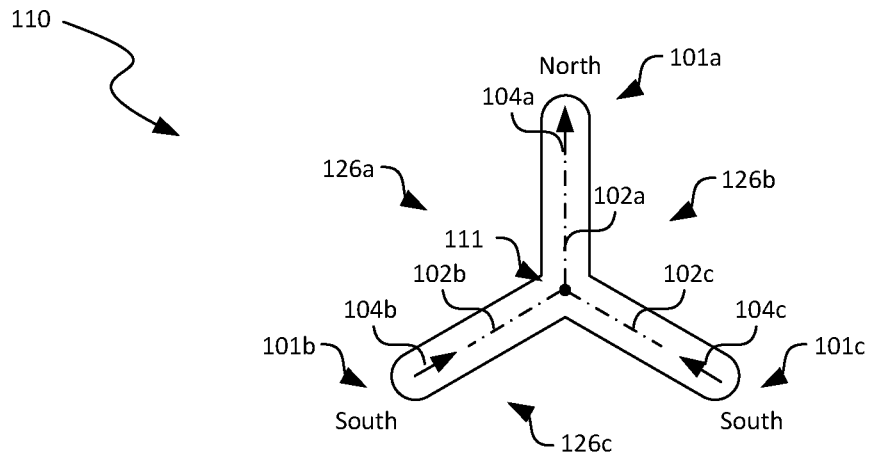
FIGS. 2A-2C are schematic diagrams illustrating example nanomagnetic triangles suitable for the data storage and processing device of FIGS. 1A and 1B in accordance with embodiments of the disclosed technology.
Figure 2B:
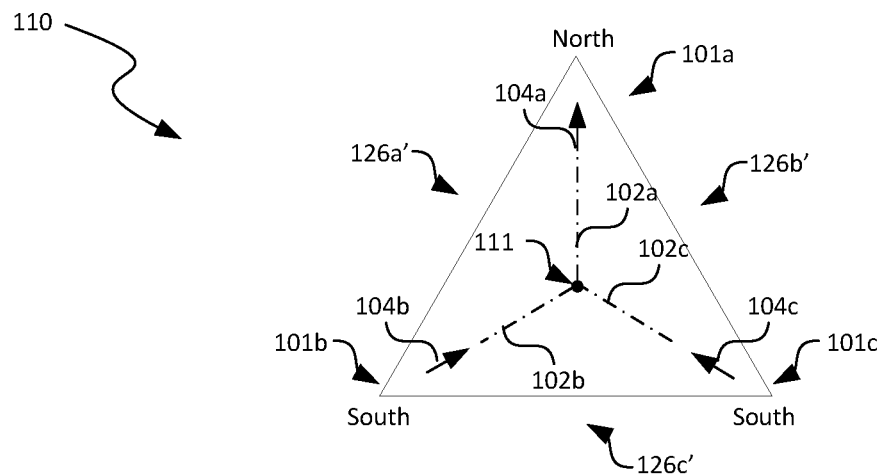
Figure 2C:
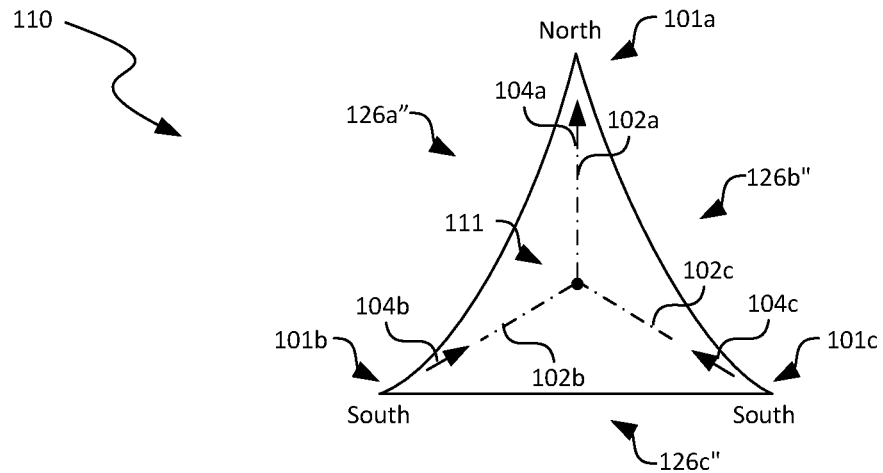

FIGS. 2A-2C are schematic diagrams illustrating example nanomagnetic triangles 110 suitable for the data storage and processing device 100 of FIGS. 1A and 1B in accordance with embodiments of the disclosed technology. As shown in FIG. 2A, a nanomagnetic triangle 100 can include first, second, and third axes 102a-102c, respectively, (referred to collectively as "axes 102") extending from a center 111 of the nanomagnetic triangle 110 toward first, second, and third vertices 101a-101c (referred to collectively as "vertices 101"). Each axis 102 can have a magnetic ground state different than those of the other axes 102.

For ease of description, in the present disclosure, a magnetic direction extending away from the center 111 of the nanomagnetic triangle 110 toward one of the vertices 101 is referred to as having a "North" direction while the opposite is referred to as having a "South" direction. Also, in the illustrated embodiments, having a North direction is encoded as a logic "1" while having a South direction is encoded as a logic "0" for illustration purposes. In other embodiments, the encoding of logic values can be reversed or have other suitable configurations. The nanomagnetic triangle 110 can also have first, second, and third sides 126a-126c (referred to collectively as "sides 126") between pairs of the vertices 101. In the example shown in FIG. 2A, the sides 126 of the nanomagnetic triangle 110 are multi-collinear. In the example shown in FIG. 2B, the sides 126' can each be linear or form a straight line. In yet another example shown in FIG. 2C, some of the sides 126" of the nanomagnetic triangle 110 can be curved while another can be linear. In further examples, the sides 126 can have other suitable shapes or configurations.

It is believed that magnetic directions along different axes 102 of the nanomagnetic triangle 110 are correlated in such a way as to avoid forming a magnetic monopole. A magnetic monopole is a hypothetical elementary particle that is an isolated magnet with only one magnetic pole (e.g., a North pole without a South pole, or vice versa). A magnetic monopole would have a net North or South "magnetic charge." In practical applications, it is believed that no known experimental or observational evidence exists to support that magnetic monopoles exist. As such, the nanomagnetic triangle 110 would have at least one axis 102 with a magnetic direction that is different than the other axes 102 to avoid forming a magnetic monopole. For example, as shown in FIG. 2A, the first axis 102a can have a North direction (as indicated by arrow 104a) while the second and third axes 102b and 102c have a South direction (as indicated by arrows 104b and 104c, respectively). In addition, for the same reason, when magnetic directions of two axes 102 are fixed (e.g., with external bias components 112 shown in FIG. 1B), the magnetic direction of the remaining axis 102 can be flipped. For instance, in the example shown in FIG. 2A, if the first axis 102a is switched to "South" while the second axis 102b is fixed at "South," the magnetic direction of the third axis 102c can be flipped from South to North to avoid forming a magnetic monopole. Utilizing the foregoing features of the nanomagnetic triangle 110, several embodiments of the disclosed technology provide a single storage and processing device 100 that can process and persistently store data without a constant power supply, as described in more detail below with reference to FIGS. 3A-3C.

Figure 3A:
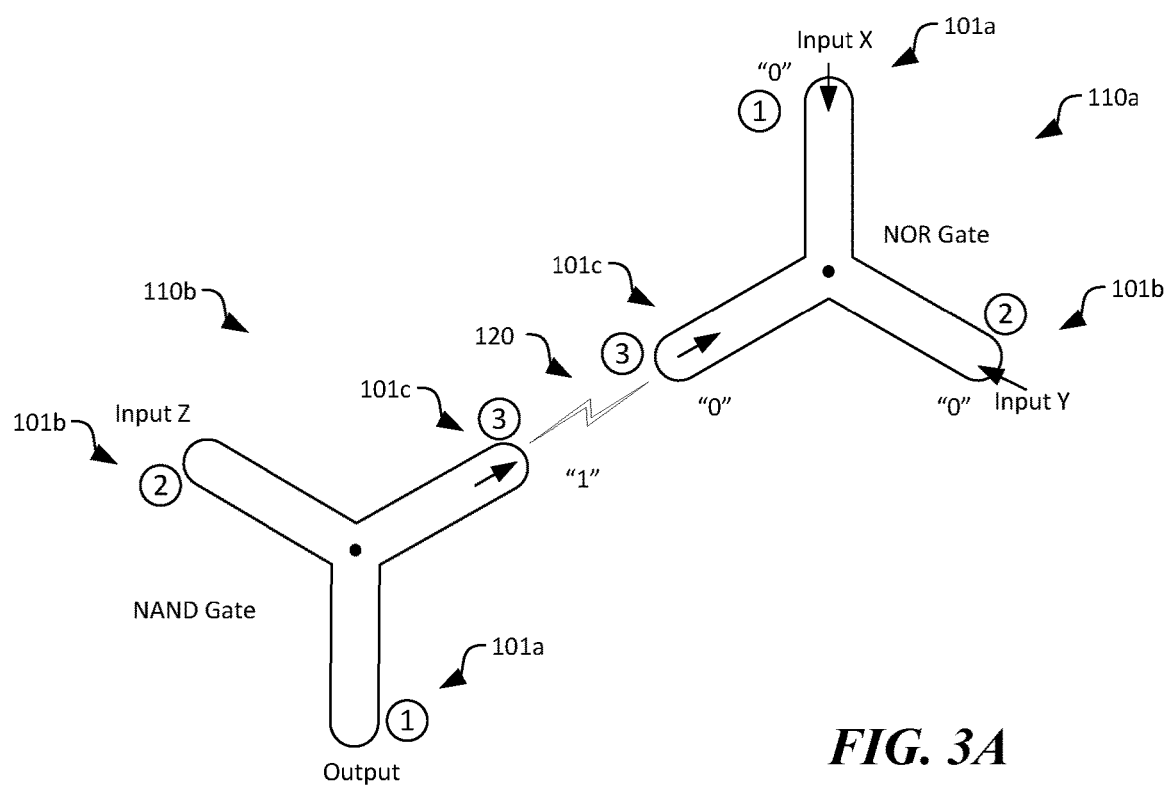
FIGS. 3A-3C are schematic diagrams illustrating an example data processing sequence in the data storage and processing device of FIGS. 1A and 1B in accordance with embodiments of the disclosed technology.
Figure 3B:
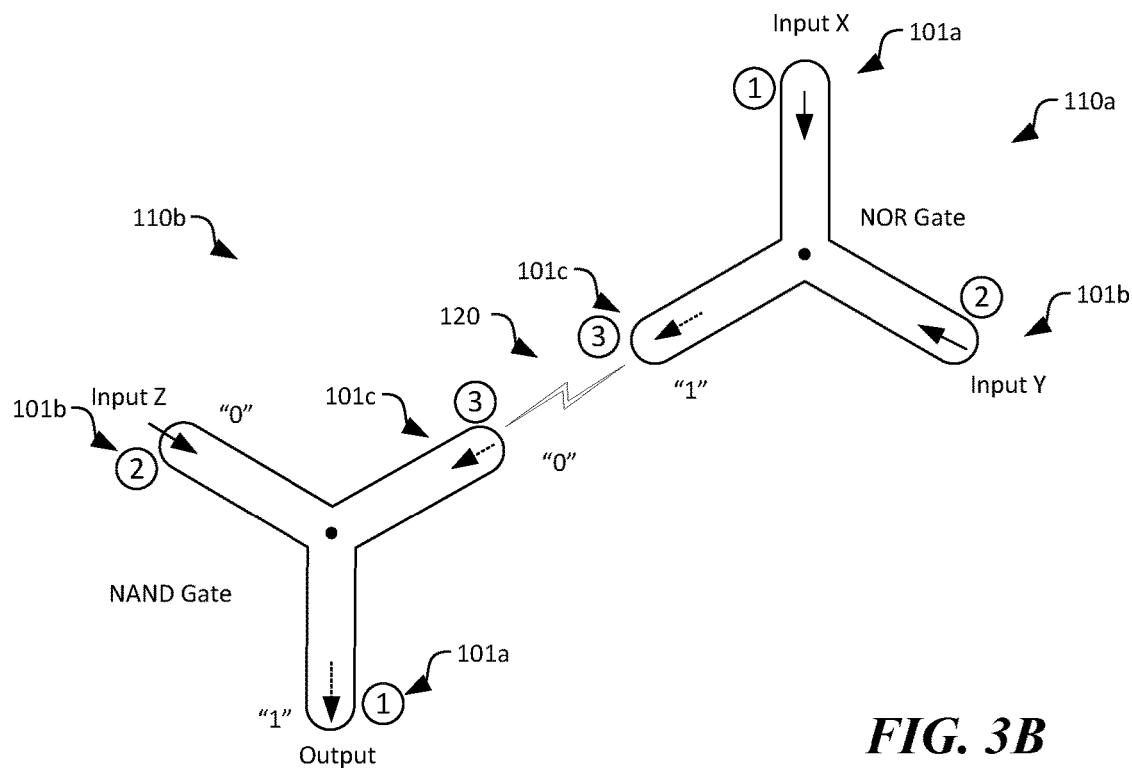
Figure 3C:
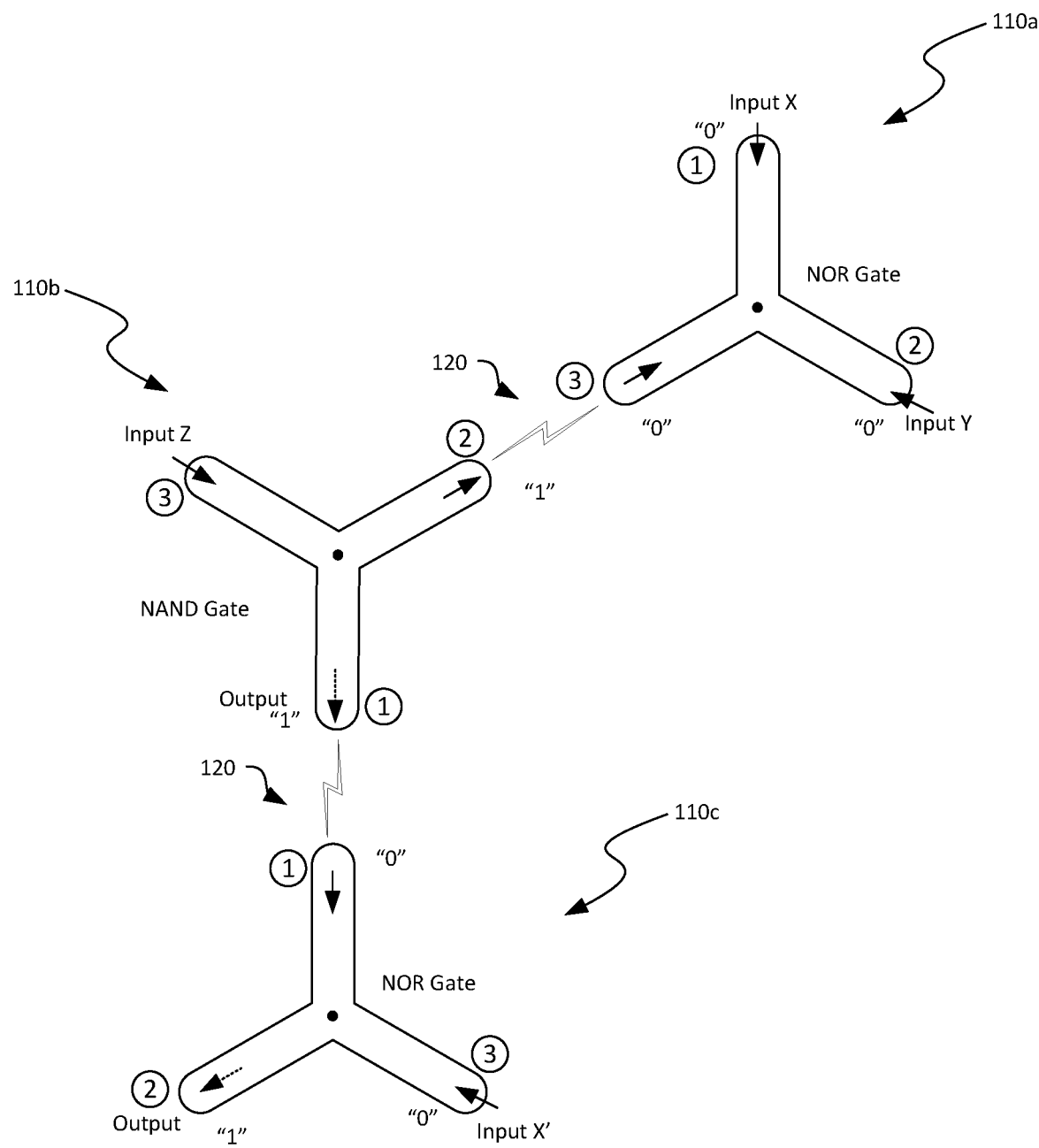

FIGS. 3A-3C are schematic diagrams illustrating an example data processing sequence in the data storage and processing device 100 of FIGS. 1A and 1B in accordance with embodiments of the disclosed technology. In one aspect, the storage and processing device 100 can include multiple nanomagnetic triangles 110 coupled to one another via magnetic coupling to form a processing circuit according to target logic. For example, as shown in FIG. 3A, the processing sequence can include a first nanomagnetic triangle 110a coupled to a second nanomagnetic triangle 110b via a magnetic coupling 120. In FIG. 3A, each vertex 101 is marked with a number in a circle for ease of identification. Though only two nanomagnetic triangles 110 are shown in FIGS. 3A and 3B for illustration purposes, in other embodiments, the processing sequence can include three, four, or any suitable number of nanomagnetic triangles 110 coupled to one another.

According to aspects of the disclosed technology, each of the nanomagnetic triangles 110 can be configured as a NOR, NAND, or other suitable types of gates can be magnetically coupled to one another to form the processing circuit. For example, the first nanomagnetic triangle 110a can be configured as a NOR gate with Input X on the first vertex 101a and Input Y on the second vertex 101b. As such, when the first and second vertices 101a and 101b acting as input are set to "0," the third vertex 101c acting as an output is forced to "1" to avoid forming a magnetic monopole. In another example, the second nanomagnetic triangle 110b can be configured as a NAND gate. As such, when the second and third vertices 101b and 101c are both set to "1," the first vertex 101a acting as an output is forced to "0" to avoid forming a magnetic monopole.

Multiple such NAND or NOR gates can then be magnetically coupled together to form a processing circuit or other types of additional gates. For instance, as shown in FIG. 3A, the first nanomagnetic triangle 110a with first and second vertices 101a and 101b as input to a NOR gate and a third vertex 101c can be placed adjacent to a third vertex 101c of the second nanomagnetic triangle 110b acting as a NAND gate. The second nanomagnetic triangle 110b also includes a first vertex 101a as an output and a second vertex 101b as an input of the NAND gate. In certain embodiments, individual nanomagnetic triangles 110 and/or gates can be biased or "programmed" at runtime like operations of field programmable gate array (FPGA). In other embodiments, individual nanomagnetic triangles 110 and/or gates can be programmed during manufacturing and may be reprogrammable during use or at other suitable times.

During operation, the third vertex 101c of the first nanomagnetic triangle 110a can be initially biased to have a South polarity (or a logic "0") and magnetically coupled to the third vertex 101c of the second nanomagnetic triangle 110b that is biased to have a North polarity (or a logic "1"). As such, the third vertex 101c of the second nanomagnetic triangle 110b can be initially biased to have a South polarity (or a logic "0"). Then, when both the first and second vertices 101a and 101b of the first nanomagnetic triangle 110a are biased to have a South polarity or logic "0," the third vertex of the first nanomagnetic triangle 110a would be forced to flip from a logic "0" to "1" indicating a positive result for the NOR logic.

Due to the magnetic coupling 120 between the third vertices 101c of the first and second nanomagnetic triangles 110a and 110b, the polarity of the third vertex 101c of the second nanomagnetic triangle 110b can be flipped from "1" to "0." For example, as shown in FIG. 3B, when the second vertex 101b of the second nanomagnetic triangle 110b as input to the NAND is biased to "0," the polarity at the first vertex 101a of the second nanomagnetic triangle 110b (i.e., the output) is flipped from "0" to "1" to indicate a positive result for the NAND logic. On the other hand, if only one of the first or second vertices 101a and 101b of the first nanomagnetic triangle 110a is biased to "0," then the third vertex 101c of the first nanomagnetic triangle 110a would not change polarity. Thus, the polarity of the vertices 101a-101c of the second nanomagnetic triangle 110b would be maintained to have an output of "0." The output from the first vertex 101a of the second nanomagnetic triangle 110b can be magnetically coupled to additional triangles 110, such as a third nanomagnetic triangle 110c shown in FIG. 3C.

Several embodiments of the storage and processing device 100 can perform logic operations and persistently store a processor state without a constant power supply. Unlike DRAMs, the multiple nanomagnetic triangles 110 can modify magnetic polarities of adjacent triangles 110 and maintain respective magnetic states even when power is lost. For instance, in the foregoing example circuit, if power is lost after the input at the first and second vertices 101a and 101b of the first nanomagnetic triangle 110a were biased to "0," the output of "1" at the second vertex 101b of the second nanomagnetic triangle 110b would still be achieved via magnetic coupling and be maintained. After power is restored, a magnetic sensor 112 (shown in FIG. 1B) can then be used to read the maintained value at the first vertex 101a of the second nanomagnetic triangle 110b. As such, embodiments of the storage and processing device 100 can be cost effective to operate without using backup batteries, special shutdown procedures, or other techniques in response to power losses.

In addition, several embodiments of the foregoing single device can operate not only with binary data but also heximal data, i.e., base-six data. For instance, each vertex of a nanomagnetic triangle 110 can have two states: North (or a logic "1") or South (or a logic "0"). As such, as shown in FIGS. 4A-4F, possible combinations of magnetic states of the triangle without forming a magnetic monopole can include the following:

(1, 0, 0);
(1, 1, 0);
(0, 0, 1);
(1, 0, 1);
(0, 1, 0);
(0, 1, 1).

As such, each nanomagnetic triangle 110 can contain three times the information than a binary bit. Information density can thus be significantly increased to reduce a size of a storage component as well as reducing data access latency.

Figure 5A:
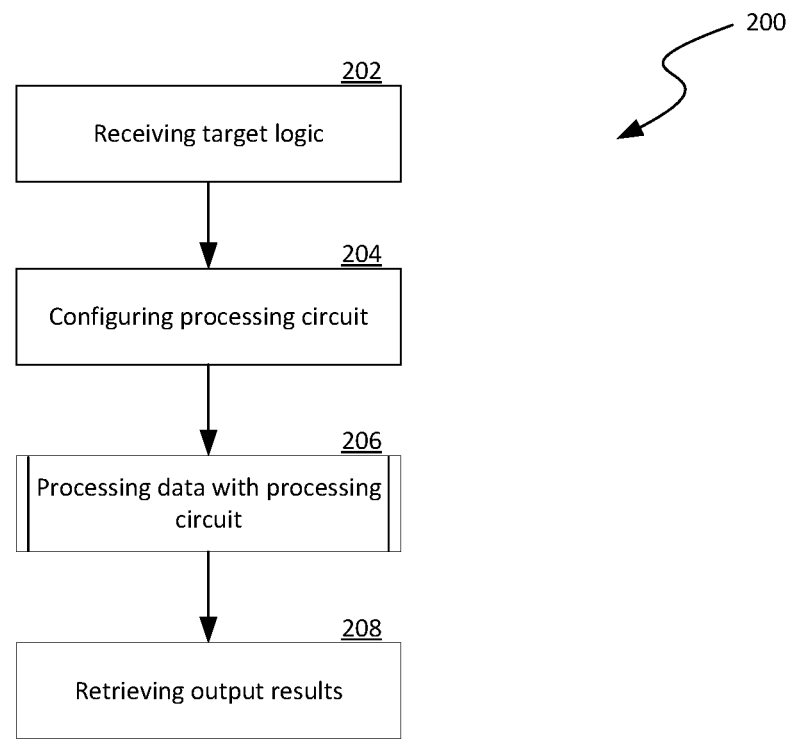
FIGS. 5A and 5B are flowcharts illustrating various processes for storing and/or processing data using the storage and processing device of FIGS. 1A and 1B in accordance with embodiments of the disclosed technology.
Figure 5B:
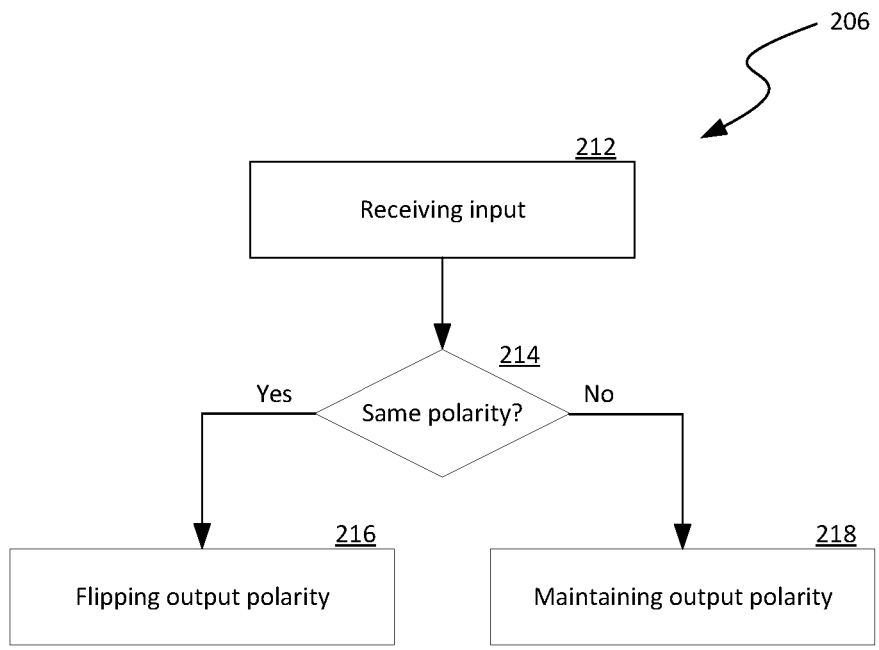

FIGS. 5A and 5B are flowcharts illustrating various processes for storing and/or processing data using the storage and processing device 100 of FIGS. 1A and 1B in accordance with embodiments of the disclosed technology. Though the process 200 is described below in the context of the storage and processing device 100 of FIGS. 1A and 1B, embodiments of the process 200 can be performed in other suitable devices with similar or different components.

As shown in FIG. 5A, the process 200 can include receiving target logic at stage 202. In certain embodiments, target logic can be received from an external component, such as a processor. In other embodiments, the target logic can be generated at least partially internally to the storage and processing device 100. The process 200 can then include configuring a processing circuit according to the received target logic at stage 204. In one embodiment, an external processor or controller can configure the processing circuit according to the target logic. In other embodiments, the processing circuit can be configured in other suitable ways. In further embodiments, configuring the processing circuit may be omitted when, for example, the target logic was configured previously.

The process 200 can then include receiving input to the processing circuit and processing the received input with the processing circuit at stage 206. Example operations of processing the received input are described in more detail below with reference to FIG. 5B. The process 200 can then include retrieving output results from the processing circuit at stage 208. For example, a magnetic sensor 112 (FIG. 1A) may be used to detect a magnetic stage of a vertex 101 (FIG. 3A) of a particular nanomagnetic triangle 110 (FIG. 3A) in the processing circuit.

As shown in FIG. 5B, processing the received signal can include receiving the input at a vertex of a nanomagnetic triangle at stage 212. In response to the received signal, the operations include a decision stage to determine whether the polarity at the vertex receiving the input is the same as that of another vertex of the nanomagnetic triangle. In response to a positive decision, the operations include flipping a polarity at a further vertex of the nanomagnetic triangle acting as an output at stage 216. In response to a negative decision, the operations include maintaining the output polarity at the further vertex of the nanomagnetic triangle acting as an output at stage 218.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A non-volatile data processing or storage device, comprising:
a processing circuit having a substrate and a plurality of nanomagnetic triangles carried by the substrate and spaced apart from one another, the plurality of nanomagnetic triangles having shape-induced magnetic anisotropy and individually include:
a geometric center; and
first, second, and third vertices extending away from the geometric center along first, second, and third axes, respectively, the first, second, and third axes being at least approximately equal spaced from one another radially; and
wherein one of the plurality of nanomagnetic triangles has a first vertex magnetically coupled to a second vertex of another of the plurality of nanomagnetic triangles such that a magnetic polarity change at the first vertex at the one of the plurality of nanomagnetic triangles causes a responsive magnetic polarity change at the second vertex at the another of the plurality of nanomagnetic triangles to generate an output of the processing circuit.

2. The non-volatile data processing or storage device of claim 1 wherein the plurality of nanomagnetic triangles individually further include:
first, second, and third magnetic directions along each of the first, second, and third axes, respectively; and
the first, second, third magnetic directions are related to one another as to avoid forming a magnetic monopole.

3. The non-volatile data processing or storage device of claim 1 wherein the plurality of nanomagnetic triangles individually further include:
first, second, and third sides each extending between adjacent pairs of first, second, or third vertices; and
the first, second, and third sides are linear, curved, or multicollinear.

4. The non-volatile data processing or storage device of claim 1 wherein the plurality of nanomagnetic triangles individually further include:
first, second, and third sides each extending between adjacent pairs of first, second, or third vertices; and
a spatial dimension between the first vertex of the one of the plurality of nanomagnetic triangles and the second vertex of the another of the plurality of nanomagnetic triangles is approximately 10% of a dimension of the first, second, and third sides.

5. The non-volatile data processing or storage device of claim 1 wherein:
the one of the plurality of nanomagnetic triangles includes second and third vertices configured to individually receive first and second input signals, respectively; and
the first vertex of the one of the plurality of nanomagnetic triangles is configured to provide an output signal based on the received first and second input signals such that to avoid forming a magnetic monopole at the one of the plurality of nanomagnetic monopoles.

6. The non-volatile data processing or storage device of claim 1 wherein:
the one of the plurality of nanomagnetic triangles includes second and third vertices configured to individually receive first and second input signals, respectively;
the first vertex of the one of the plurality of nanomagnetic triangles is configured to provide an output signal based on the received first and second input signals such that to avoid forming a magnetic monopole at the one of the plurality of nanomagnetic monopoles; and the second vertex of the another of the plurality of nanomagnetic triangles is configured to have a polarity opposite to that corresponding to the output signal from the first vertex of the one of the plurality of nanomagnetic triangles.

7. The non-volatile data processing or storage device of claim 1 wherein:
the one of the plurality of nanomagnetic triangles includes second and third vertices configured to individually receive first and second input signals, respectively;
the first vertex of the one of the plurality of nanomagnetic triangles is configured to provide an output signal based on the received first and second input signals such that to avoid forming a magnetic monopole at the one of the plurality of nanomagnetic monopoles;
the second vertex of the another of the plurality of nanomagnetic triangles is configured to have a polarity opposite to that corresponding to the output signal from the first vertex of the one of the plurality of nanomagnetic triangles; and
the another of the plurality of nanomagnetic triangles includes a first vertex configured to receive another input signal and a third vertex configured to provide another output signal, wherein the output signal at the third vertex is determined by polarities at the first and second vertices as to avoid forming a magnetic monopole at the another of the plurality of nanomagnetic monopole.

8. The non-volatile data processing or storage device of claim 1 wherein:
the one of the plurality of nanomagnetic triangles is configured as a NOR gate; and
the another of the plurality of nanomagnetic triangles is configured as a NAND gate.

9. The non-volatile data processing or storage device of claim 1 wherein:
the one of the plurality of nanomagnetic triangles is configured as a NOR gate;
the another of the plurality of nanomagnetic triangles is configured as a NAND gate; and
a further one of the plurality of nanomagnetic triangles is magnetically coupled to the another of the plurality of nanomagnetic triangles, the further one of the plurality of nanomagnetic triangles is configured as a NOR gate.

10. The non-volatile data processing or storage device of claim 1 wherein at least one of the plurality of nanomagnetic triangles is encoded to represent heximal data.

11. A method of processing data using a processing circuit having multiple magnetically coupled nanomagnetic triangles, the method comprising:
configuring the processing circuit based on target logic, the processing circuit having a substrate and a plurality of nanomagnetic triangles carried by the substrate and spaced apart from one another, the plurality of nanomagnetic triangles having shape-induced magnetic anisotropy and individually include:
a geometric center;
first, second, and third vertices extending away from the geometric center along first, second, and third axes, respectively, the first, second, and third axes being at least approximately equal spaced from one another radially; and
first, second, and third magnetic directions along each of the first, second, and third axes, respectively;
receiving an input signal to the configured processing circuit;

executing the target logic with the processing circuit upon receiving the provided input signal; and retrieving, from the processing circuit, data representing output results.

12. The method of claim 11, where configuring the processing circuit includes configuring at least some of the plurality of nanomagnetic triangles as NOR or NAND gates.

13. The method of claim 11, where configuring the processing circuit includes configuring at least some of the plurality of nanomagnetic triangles as NOR or NAND gates and setting initial magnetic directions along at least one of the first, second, or third axes at one of the plurality of nanomagnetic triangles.

14. The method of claim 11, wherein:

receiving the input signal to the configured processing circuit includes receiving a magnetic polarity input at a first vertex of one of the plurality of nanomagnetic triangles having a second vertex and a third vertex configured as an output; and upon receiving the magnetic polarity input,
determining whether the received magnetic polarity is the same as a magnetic polarity at the second vertex; and
in response to determining that the received magnetic polarity is the same as the magnetic polarity at the second vertex, reversing a magnetic polarity at the third vertex.

15. The method of claim 11, wherein:

receiving the input signal to the configured processing circuit includes receiving a magnetic polarity input at a first vertex of one of the plurality of nanomagnetic triangles having a second vertex and a third vertex configured as an output; and upon receiving the magnetic polarity input,
determining whether the received magnetic polarity is the same as a magnetic polarity at the second vertex; and
in response to determining that the received magnetic polarity is not the same as the magnetic polarity at the second vertex, maintaining a magnetic polarity at the third vertex.

16. The method of claim 11, wherein:

receiving the input signal to the configured processing circuit includes receiving a magnetic polarity input at a first vertex of one of the plurality of nanomagnetic triangles having a second vertex and a third vertex configured as an output; and upon receiving the magnetic polarity input,
determining whether the received magnetic polarity is the same as a magnetic polarity at the second vertex; and
in response to determining that the received magnetic polarity is the same as the magnetic polarity at the second vertex,
reversing a magnetic polarity at the third vertex at the one of the plurality of nanomagnetic triangles; and
in response to the reversed magnetic polarity at the third vertex at the one of the plurality of nanomagnetic triangles, reversing a magnetic polarity of a third vertex of another of the plurality of nanomagnetic triangles magnetically coupled to the one of the plurality of magnetic triangles.

17. The method of claim 11, wherein:

receiving the input signal to the configured processing circuit includes receiving a magnetic polarity input at a first vertex of one of the plurality of nanomagnetic triangles having a second vertex and a third vertex configured as an output; and upon receiving the magnetic polarity input,
determining whether the received magnetic polarity is the same as a magnetic polarity at the second vertex; and
in response to determining that the received magnetic polarity is not the same as the magnetic polarity at the second vertex,
maintaining a magnetic polarity at the third vertex at the one of the plurality of nanomagnetic triangles; and
in response to the maintained magnetic polarity at the third vertex at the one of the plurality of nanomagnetic triangles, maintaining a magnetic polarity of a third vertex of another of the plurality of nanomagnetic triangles magnetically coupled to the one of the plurality of magnetic triangles.

18. A non-volatile data processing or storage device, comprising:

a processing circuit having a substrate and a plurality of nanomagnetic elements carried by the substrate and spaced apart from one another, the plurality of nanomagnetic elements having shape-induced magnetic anisotropy and individually include:
a geometric center; and
at least three vertices extending away from the geometric center along at least three axes, respectively, the at least three axes being at least approximately equal spaced from one another radially; and
wherein one of the plurality of nanomagnetic elements has a vertex magnetically coupled to another vertex of another of the plurality of nanomagnetic elements such that a magnetic polarity change at the vertex at the one of the plurality of nanomagnetic elements causes a responsive magnetic polarity change at the another vertex at the another of the plurality of nanomagnetic elements to generate an output of the processing circuit.

19. The non-volatile data processing or storage device of claim 18 wherein the plurality of nanomagnetic elements individually further include:

at least three magnetic directions along each of the first, second, and third axes, respectively; and the at least three directions are related to one another as to avoid forming a magnetic monopole.

20. The non-volatile data processing or storage device of claim 18 wherein the plurality of nanomagnetic elements individually further include:

at least three sides each extending between adjacent pairs of vertices; and the at least three sides are linear, curved, or multicollinear.

* * * * *